United States Patent
Fong et al.

(10) Patent No.: US 8,994,417 B2
(45) Date of Patent: *Mar. 31, 2015

(54) METHOD AND SYSTEM FOR SYNCHRONIZING THE PHASE OF A PLURALITY OF DIVIDER CIRCUITS IN A LOCAL-OSCILLATOR SIGNAL PATH

(71) Applicant: MediaTek Singapore Pte. Ltd., Singapore (SG)

(72) Inventors: Keng Leong Fong, Sunnyvale, CA (US); John Wong, San Jose, CA (US); Jenwei Ko, Cupertino, CA (US)

(73) Assignee: MediaTek Singapore Pte. Ltd., Singapore (SG)

( * ) Notice: Subject to any disclaimer, the term of this patent is extended or adjusted under 35 U.S.C. 154(b) by 0 days.

This patent is subject to a terminal disclaimer.

(21) Appl. No.: 14/192,704

(22) Filed: Feb. 27, 2014

(65) Prior Publication Data

US 2014/0312948 A1 Oct. 23, 2014

Related U.S. Application Data

(63) Continuation of application No. 13/401,706, filed on Feb. 21, 2012, now Pat. No. 8,704,559.

(51) Int. Cl.
*H03L 7/00* (2006.01)
(52) U.S. Cl.
CPC ........................................ *H03L 7/00* (2013.01)
USPC .............. 327/141; 327/115; 327/117; 377/47

(58) Field of Classification Search
USPC ............ 327/115, 117, 118, 141, 360; 377/47, 377/48
See application file for complete search history.

(56) References Cited

U.S. PATENT DOCUMENTS

| | | | | |
|---|---|---|---|---|
| 5,389,826 A * | 2/1995 | Sonobe | ......................... | 307/125 |
| 6,466,073 B1 * | 10/2002 | Yukinari et al. | ............... | 327/291 |
| 7,724,059 B2 * | 5/2010 | Kapur | ............................ | 327/299 |
| 7,822,168 B2 * | 10/2010 | Mitsuishi | ......................... | 377/47 |
| 7,969,251 B2 * | 6/2011 | Fu et al. | ............................ | 331/74 |
| 7,973,574 B2 * | 7/2011 | Oh | ............................... | 327/115 |
| 8,001,410 B2 * | 8/2011 | Lin | ................................ | 713/500 |
| 8,030,975 B2 * | 10/2011 | Bazes | ............................ | 327/115 |
| 8,294,493 B2 * | 10/2012 | Shanan | ........................... | 327/115 |
| 2009/0219063 A1 * | 9/2009 | Kehrer et al. | ................. | 327/117 |

* cited by examiner

*Primary Examiner* — William Hernandez
(74) *Attorney, Agent, or Firm* — Sawyer Law Group, P.C.

(57) ABSTRACT

A method and system for synchronizing the output signal phase of a plurality of frequency divider circuits in a local-oscillator (LO) or clock signal path is disclosed. The LO path includes a plurality of frequency divider circuits and a LO buffer for receiving a LO signal coupled to the plurality of frequency divider circuits. The method and system comprise adding offset voltage and setting predetermined state to each of the frequency divider circuits; and enabling the frequency divider circuits. The method and system includes enabling the LO buffer to provide the LO signal to the frequency divider circuits after they have been enabled. When the LO signal drives each of the frequency divider circuits, each of the frequency divider circuits starts an operation. Finally the method and system comprise removing the offset voltage from each of the frequency divider circuits to allow them to effectively drive other circuits.

20 Claims, 5 Drawing Sheets

100

METHOD AND SYSTEM FOR SYNCHRONIZING THE PHASE OF A PLURALITY OF DIVIDER CIRCUITS IN A LOCAL-OSCILLATOR SIGNAL PATH

CROSS-REFERENCE TO RELATED APPLICATION

Under 35 U.S.C. 120, this application is a Continuation Application and claims priority to U.S. application Ser. No. 13/401,706, filed Feb. 21, 2012, entitled "METHOD AND SYSTEM FOR SYNCHRONIZING THE PHASE OF A PLURALITY OF DIVIDER CIRCUITS IN A LOCAL-OSCILLATOR SIGNAL PATH," which is incorporated herein by reference.

FIELD OF THE INVENTION

The present invention relates generally to local-oscillator signal path or clock signal path and more particularly to a method and system for synchronizing the phase of output signals of a plurality of divider circuits.

BACKGROUND OF THE INVENTION

In a multiple-input multiple-output (MIMO) system where there are multiple transceivers, and each transceiver uses its own divider circuits to generate the desired local-oscillator (LO) frequency. The first time the divider circuits are enabled, the phase ambiguity needs to be calibrated by a loopback mechanism at the expense of time and power consumption. It is known that the enabling and disabling of the divider circuits can cause their phase to be unsynchronized with each other when they are enabled.

This problem has been conventionally addressed by the divider circuits being enabled all the time (without disabling them) at the expense of higher power consumption. Accordingly, what is needed is a system and method to address these issues.

Accordingly, the present invention addresses such a need.

SUMMARY OF THE INVENTION

A method and system for synchronizing the phase of output signals of a plurality of frequency divider circuits in a local-oscillator signal path is disclosed. The LO path includes a plurality of frequency divider circuits and a local-oscillator (LO) buffer for receiving a LO signal coupled to the plurality of frequency divider circuits. The method and system comprise adding a predetermined offset voltage to each of the plurality of frequency divider circuits; and enabling the plurality of frequency divider circuits. The method and system includes enabling the LO buffer to provide the LO signal to the plurality of frequency divider circuits after the plurality of frequency divider circuits have been enabled. When the LO signal drives each of the plurality of frequency divider circuits, each of the plurality of frequency divider circuits starts a frequency division operation. Finally the method and system comprise removing the predetermined offset voltage from each of the plurality of frequency divider circuits to allow the plurality of frequency divider circuits to effectively drive other circuits.

DETAILED DESCRIPTION

The present invention relates generally to local-oscillator signal path or clock signal path and more particularly to a method and system for synchronizing the phase of output signals from a plurality of divider circuits. The following description is presented to enable one of ordinary skill in the art to make and use the invention and is provided in the context of a patent application and its requirements. Various modifications to the embodiments and the generic principles and features described herein will be readily apparent to those skilled in the art. Thus, the present invention is not intended to be limited to the embodiments shown, but is to be accorded the widest scope consistent with the principles and features described herein.

Figure 1:
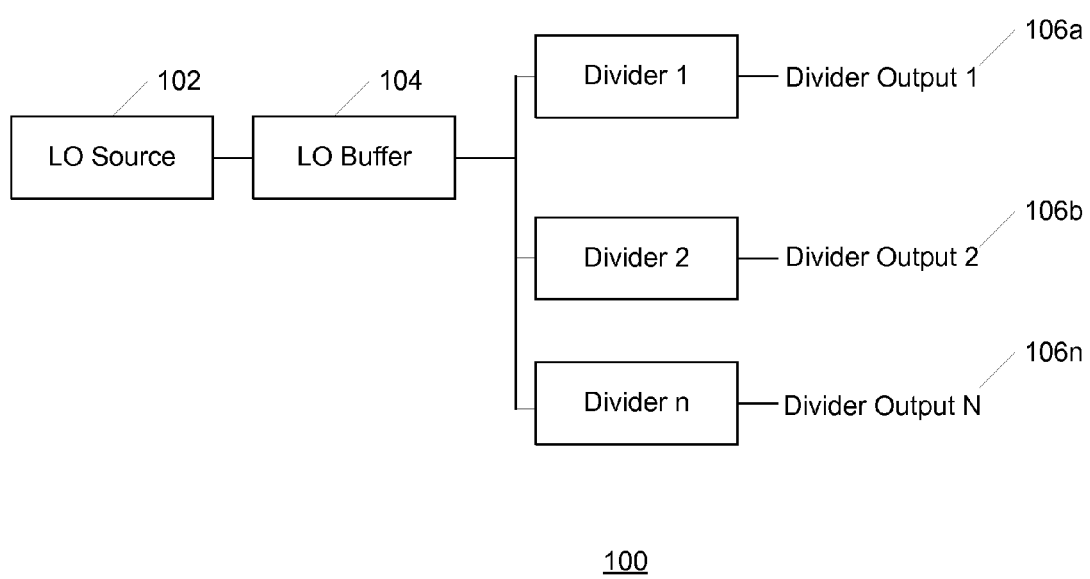
FIG. 1 is a block diagram that illustrates a local-oscillator (LO) path within a MIMO system where a LO source drives a predetermined number (N) of frequency divider circuits through a LO buffer.

FIG. 1 is a block diagram that illustrates a local-oscillator (LO) path 100 within a MIMO system where a LO source 102 drives a predetermined number (N) of frequency divider circuits 106a-106n through a LO buffer 104. Each divider circuit 106a-106n may have a different division number. For example, a divide-by-2 divider circuit divides the input frequency into half. Each time when the divider circuits 106a-106n are enabled from a disable (or power down) mode, the phase difference among the divider circuits 106a-106n may change since they are not synchronized with each other. This creates a problem in applications where phase synchronization among the divider output signals is important.

A method and system in accordance with the present invention synchronizes these output signals without requiring that the divider circuits 106a-106n be enabled continuously. This is accomplished by providing offset voltages to the divider circuits 106a-106n prior to enabling the divider circuits 106a-106n and then enabling the divider circuits 106a-106n. Thereafter, the LO buffer 104 is enabled to provide LO signals to the plurality of divider circuits 106a-106n. The LO signals initiate each divider circuit 106a-106n frequency division operation. Thereafter, the offset voltages are removed and the output signals from divider circuits 106a-06n can be utilized to drive other circuits. To describe the features of the present invention in more detail refer now to the following description in conjunction with the accompanying Figures.

A system that utilizes a synchronization procedure in accordance with the present invention can take the form of an entirely hardware implementation, an entirely software implementation, or an implementation containing both hardware and software elements. In one implementation, this synchronization procedure is implemented in software, which includes, but is not limited to, application software, firmware, resident software, microcode, etc.

Furthermore, the synchronization procedure can take the form of a computer program product accessible from a computer-usable or computer-readable medium providing program code for use by or in connection with a computer or any instruction execution system. For the purposes of this description, a computer-usable or computer-readable medium can be any apparatus that can contain, store, communicate, propagate, or transport the program for use by or in connection with the instruction execution system, apparatus, or device.

The medium can be an electronic, magnetic, optical, electromagnetic, infrared, or semiconductor system (or apparatus or device) or a propagation medium. Examples of a computer-readable medium include a semiconductor or solid state memory, magnetic tape, a removable computer diskette, a random access memory (RAM), a read-only memory (ROM), a rigid magnetic disk, and an optical disk. Current examples of optical disks include DVD, compact disk-read-only memory (CD-ROM), and compact disk-read/write (CD-RAN). To describe the features of the present invention in more detail, refer now to the following description in conjunction with the accompanying Figures.

Figure 2:
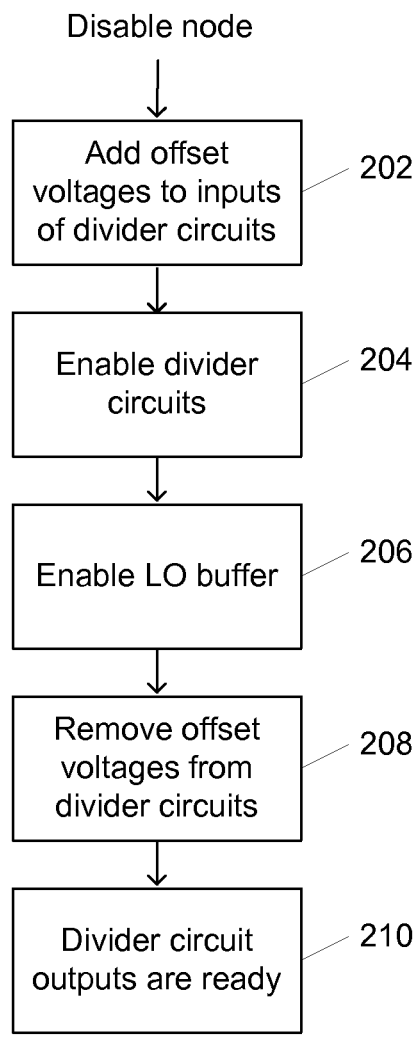
FIG. 2 is a flow chart that illustrates a synchronization procedure for the divider circuits in accordance with the present invention.

FIG. 2 is a flow chart that illustrates a synchronization procedure for the divider circuits in accordance with the present invention. Referring to FIGS. 1 and 2 together, offset voltages are first added to the inputs of the divider circuits 106a-106n when they are in the disable mode, via step 202. Next, the divider circuits 106a-106n are enabled with certain pre-defined states while the LO buffer 104 is still turned off, via step 204.

Figure 3:
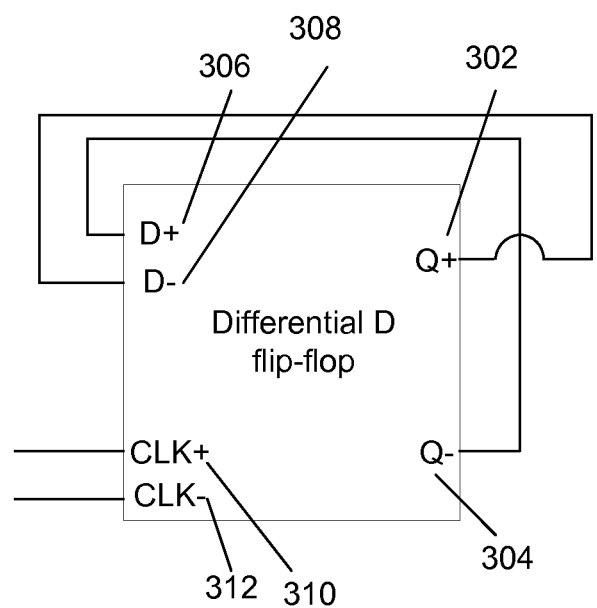
FIG. 3 illustrates an implementation of a differential divide-by-2 (divider number is 2) divider using a differential edge-triggered D flip-flop.
Figure 4:
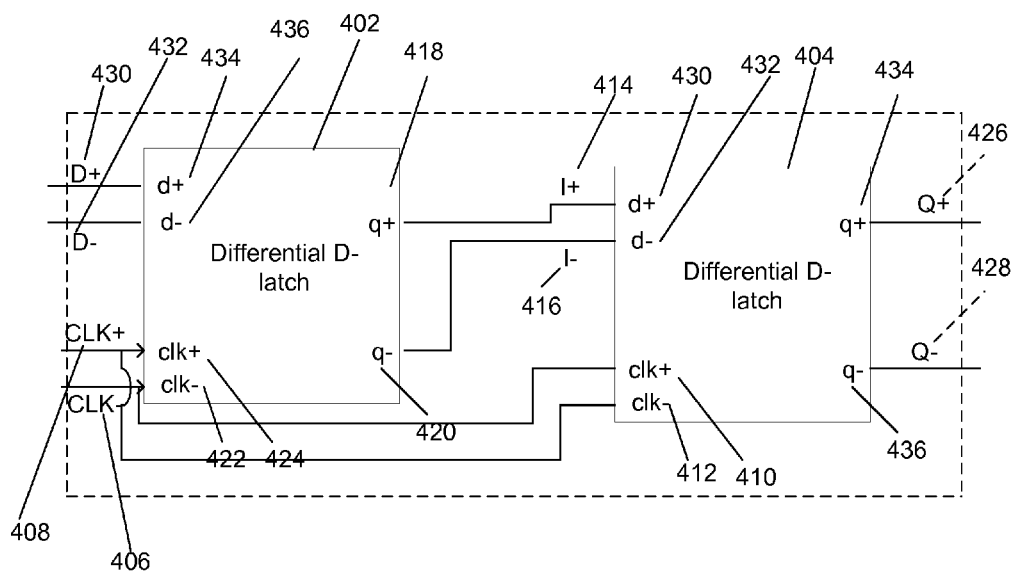
FIG. 4 illustrates an implementation of a differential D flip-flop using two differential gated D latches, arranged in a master-slave configuration.
Figure 5:
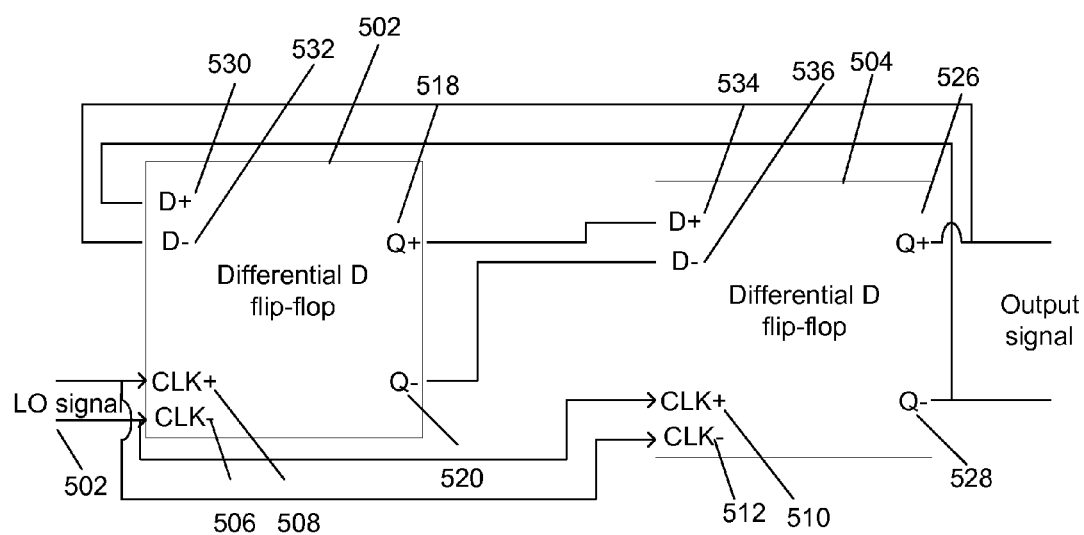
FIG. 5 illustrates a differential divide-by-4 divider which can be implemented by 2 differential D flip-flops as shown.

Typically, the divider circuits 106a-106n are implemented by differential current-mode logic (CML) circuits. These types of circuits have a positive-feedback loop which causes oscillation, if they are not driven by a strong differential LO signal at their clock inputs. To prevent oscillation in the divider circuits 106a-106n, a predetermined input offset voltage is introduced to break the positive-feedback loop. The predetermined offset voltage can be implemented at the output of the LO buffer 104 if the output of the LO buffer 104 is DC coupled to the input of the divider circuits 106a-106n. On the other hand, if the output of the LO buffer 104 is AC-coupled to the inputs of the divider circuits 106a-106n, the offset voltages need to be introduced at the inputs of the divider circuits 106a-106n. When the divider circuits 106a-106n are enabled, pre-defined states need to be set to avoid random states. FIGS. 3-5 illustrate different types of divider circuits that can be utilized in the synchronization procedure of FIG. 2.

FIG. 3 shows an implementation of a differential divide-by-2 (divider number is 2) divider using a differential edge-triggered D flip-flop 300. The D flip-flop 300 is a fully differential circuit where the output Q+ 302, the data input D+ 306 and the clock input CLK+ 310 are complementary to Q− 304, D− 308 and CLK− 312 respectively. To implement the division-by-2 operation, the differential output signals Q+ 302 and Q− 304 are connected to the differential data inputs D− 308 and D+ 306 respectively in a crossed configuration, and the differential CLK+ 310 and CLK− 312 are connected to the LO signal (not shown). If the differential clock inputs CLK+ 310 and CLK− 312 are balanced when the LO buffer is disabled, the D flip-flop 300 may oscillate because this configuration forms a positive feedback loop. To prevent oscillation, the differential clock inputs need to be unbalanced by adding offset voltage. The offset voltage can added at the differential CLK inputs (CLK+ 310 and CLK− 312) or at the differential LO buffer 104 outputs.

FIG. 4 shows an implementation of the differential D flip-flop 400 using two differential gated D latches 402 and 404, arranged in a master-slave configuration. In this configuration, the offset voltage can be added to the differential CLK inputs (CLK+ 406 and CLK− 408). Alternately, the offset voltage can be added to one or both of the differential clk inputs (clk 422 and clk− 424; clk+ 410 and clk− 412) of the D latches 402 and 404 respectively. Configured as a divider-by-2 divider as in FIG. 3, the differential output signals I+ 414 and I−416 have the same output frequency as the differential output signals Q+ 426 and Q− 428, and the phase difference between these two differential signals is 90 degrees. These in-phase (I) and quadrature-phase (Q) signals can be used to drive I and Q mixers in a RF transceiver.

A differential divide-by-4 divider 500 can be implemented by 2 differential D flip-flops 502 and 504 as shown in FIG. 5. To prevent oscillation, the offset voltage can be added to one or both of the differential CLK inputs 506-508, 510-512 of the differential D flip-flops 502 and 504 respectively. Alternately, the offset voltage can be added to one of the 4 latches within the 2 flip-flops 502 and 504.

Referring back to FIGS. 1 and 2, next the LO buffer 104 is enabled to drive the divider circuits, via step 206. When the divider circuits 106a-106n receive the LO signal from the LO buffer 104, the frequency division operation of the divider circuits 106a-106n will be started if the LO signal swing is large enough to overcome the offset voltages. In other words, the offset voltage added cannot be so large that they prevent the LO signal from driving the divider circuits 106a-106n to perform the frequency division operations. For example, if the offset voltage is 50 mV, the LO signals should be at least larger than 50 mV, but preferably larger than 100 mV. Since all the divider circuits 106a-106n receive the LO signal at the same time, their output phases are synchronized with each other. Lastly, the offset voltages need to be removed so that they do not degrade the signal quality of each of the divider circuits 106a-106n, such as phase noise and phase accuracy, of the divider outputs, via step 208. Before the outputs of the divider circuits 106a-106n are used to drive other circuits, the DC offsets need to be removed to prevent the offset voltages from degrading the performance of the divider circuits and the divider output signal qualities. In the case of the divide-by-2 divider 300 of FIG. 3, the offset voltage would degrade the output signal phase noise and the phase difference between the differential I and Q output signals. At this point, the divider outputs are ready to be used to drive other circuits, via step 210.

A method and system in accordance with the present invention synchronizes output signals of the frequency divider without requiring that the divider circuits be enabled continuously. This is accomplished by providing offset voltages to the divider circuits prior to enablement and then enabling the divider circuits. Thereafter, an LO buffer is enabled to provide LO buffer signals to the plurality of divider circuits. The LO buffer signal is such that each of the divider circuit's frequency division operation can then be initiated. In doing so, the LO path can be turned off when not in use without affecting the phase difference among the divider output signals when they are turned on.

Although the present invention has been described in accordance with the embodiments shown, one of ordinary skill in the art will readily recognize that there could be variations to the embodiments and those variations would be within the spirit and scope of the present invention. Accordingly, many modifications may be made by one of ordinary skill in the art without departing from the spirit and scope of the appended claims.

What is claimed is:

1. A method for synchronizing the phase of a local-oscillator (LO) signal path, the signal path including a plurality of frequency divider circuits and a local-oscillator (LO) buffer for receiving an LO signal coupled to the plurality of frequency divider circuits the method comprising:

adding an offset voltage and setting a predetermined state to each of the plurality of frequency divider circuits prior to enabling the plurality of frequency divider circuits;

enabling the plurality of frequency divider circuits;

enabling the LO buffer to provide the LO signal to each of the plurality of frequency divider circuits; and removing the offset voltage from each of the plurality of frequency divider circuits.

2. The method of claim 1, wherein the LO signal is greater than all of the offset voltages.

3. The method of claim 1, wherein at least one of the plurality of frequency divider circuits is implemented by differential edge-triggered D flip-flops.

4. The method of claim 3, wherein the offset voltage is provided to differential clock inputs of at least one of the differential edge-triggered D flip-flops.

5. The method of claim 3, wherein the offset voltage is provided to differential LO buffer outputs.

6. The method of claim 1, wherein each of the plurality of frequency divider circuits comprises a divide-by-2 divider.

7. The method of claim 6, wherein the divide-by-2 divider comprises two differential gated D latches coupled together.

8. The method of claim 7, wherein the offset voltage is provided to at least one differential clock input of the two differential gated D latches.

9. The method of claim 1, wherein each of the plurality of frequency divider circuits comprises a divide-by-four divider.

10. The method of claim 9, wherein the divide-by-four divider comprises two differential D flip-flops coupled together.

11. A non-transitory computer readable medium containing program instructions, for synchronizing the phase of a local-oscillator (LO) signal path, the signal path including a plurality of frequency divider circuits and a local-oscillator (LO) buffer for receiving an LO signal coupled to the plurality of frequency divider circuits, the program instructions being executed by a computer, the computer performing the following functions comprising:

adding an offset voltage and setting a predetermined state to each of the plurality of frequency divider circuits prior to enabling the plurality of frequency divider circuits;

enabling the plurality of frequency divider circuits;

enabling the LO buffer to provide the LO signal to each of the plurality of frequency divider circuits; and removing the offset voltage from each of the plurality of frequency divider circuits.

12. The non-transitory computer readable medium of claim 11, wherein the LO signal is greater than all of the offset voltages.

13. A system comprising:

a local-oscillator (LO) signal path, the LO signal path further comprising: a plurality of frequency divider circuits; and an LO buffer coupled to the plurality of frequency divider circuits; and a mechanism for synchronizing the phase of the LO signal path; wherein the mechanism adds an offset voltage and sets a predetermined state to each of the plurality of frequency divider circuits prior to enabling the plurality of frequency divider circuits; enables the plurality of frequency divider circuits; enables the LO buffer to provide an LO signal to each of the plurality of frequency divider circuits; wherein the mechanism removes the offset voltage from each of the plurality of frequency divider circuits.

14. The system of claim 13, wherein the LO signal is greater than all of the offset voltages.

15. The system of claim 13, wherein at least one of the plurality of frequency divider circuits is implemented by differential edge-triggered D flip-flops.

16. The system of claim 15, wherein the offset voltage is provided to differential clock inputs of at least one of the differential edge-triggered D flip-flops.

17. The system of claim 15, wherein the offset voltage is provided to differential LO buffer outputs.

18. The system of claim 13, wherein each of the plurality of frequency divider circuits comprises a divide-by-2 divider.

19. The system of claim 13, wherein each of the plurality of frequency divider circuits comprises a divide-by-four divider.

20. The system of claim 19, wherein the divide-by-four divider comprises two differential D flip-flops coupled together.

* * * * *